(12) United States Patent
Loechelt et al.

(10) Patent No.: US 7,276,747 B2
(45) Date of Patent: Oct. 2, 2007

(54) SEMICONDUCTOR DEVICE HAVING SCREENING ELECTRODE AND METHOD

(75) Inventors: Gary H. Loechelt, Tempe, AZ (US); Peter J. Zdebel, Austin, TX (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 178 days.

(21) Appl. No.: 11/112,570

(22) Filed: Apr. 25, 2005

(65) Prior Publication Data

US 2006/0237780 A1 Oct. 26, 2006

(51) Int. Cl.
*H01L 29/76* (2006.01)

(52) U.S. Cl. ............... 257/288; 257/401; 257/E29.162; 257/E21.403; 257/E21.407

(58) Field of Classification Search ................ 257/288, 257/410, 901, 401, 345, 404, E29.162, E21.403, 257/E21.407
See application file for complete search history.

(56) References Cited

U.S. PATENT DOCUMENTS

| 6,303,961 B1* | 10/2001 | Shibib ................ 257/335 |
| 2006/0220151 A1* | 10/2006 | Loechelt et al. ............ 257/387 |
| 2006/0240625 A1* | 10/2006 | Loechelt et al. ............ 438/268 |

* cited by examiner

*Primary Examiner*—Long K. Tran
(74) *Attorney, Agent, or Firm*—Kevin B. Jackson

(57) ABSTRACT

In one embodiment, a semiconductor device is formed in a body of semiconductor material. The semiconductor device includes a screening electrode spaced apart from a channel region.

16 Claims, 9 Drawing Sheets

SEMICONDUCTOR DEVICE HAVING SCREENING ELECTRODE AND METHOD

FIELD OF THE INVENTION

This invention relates generally to semiconductor devices, and more specifically to power switching devices including high speed devices such as RF power amplifiers and methods of their manufacture.

BACKGROUND OF THE INVENTION

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In optimizing the performance of MOSFET devices, designers often are faced with trade-offs in device parameter performance. Specifically, available device structure or fabrication process choices may improve one device parameter, but at the same time such choices may degrade one or more other device parameters. For example, available structures and processes that improve the output or drive current ($I_{DS}$) capability and on resistance of a MOSFET device also degrade its breakdown voltage ($BV_{DSS}$) capability and increase gate to drain capacitance.

Accordingly, improved semiconductor device structures and methods of their manufacture are needed to address the above mentioned issues as well as others.

DETAILED DESCRIPTION OF THE DRAWINGS

Figure 1:
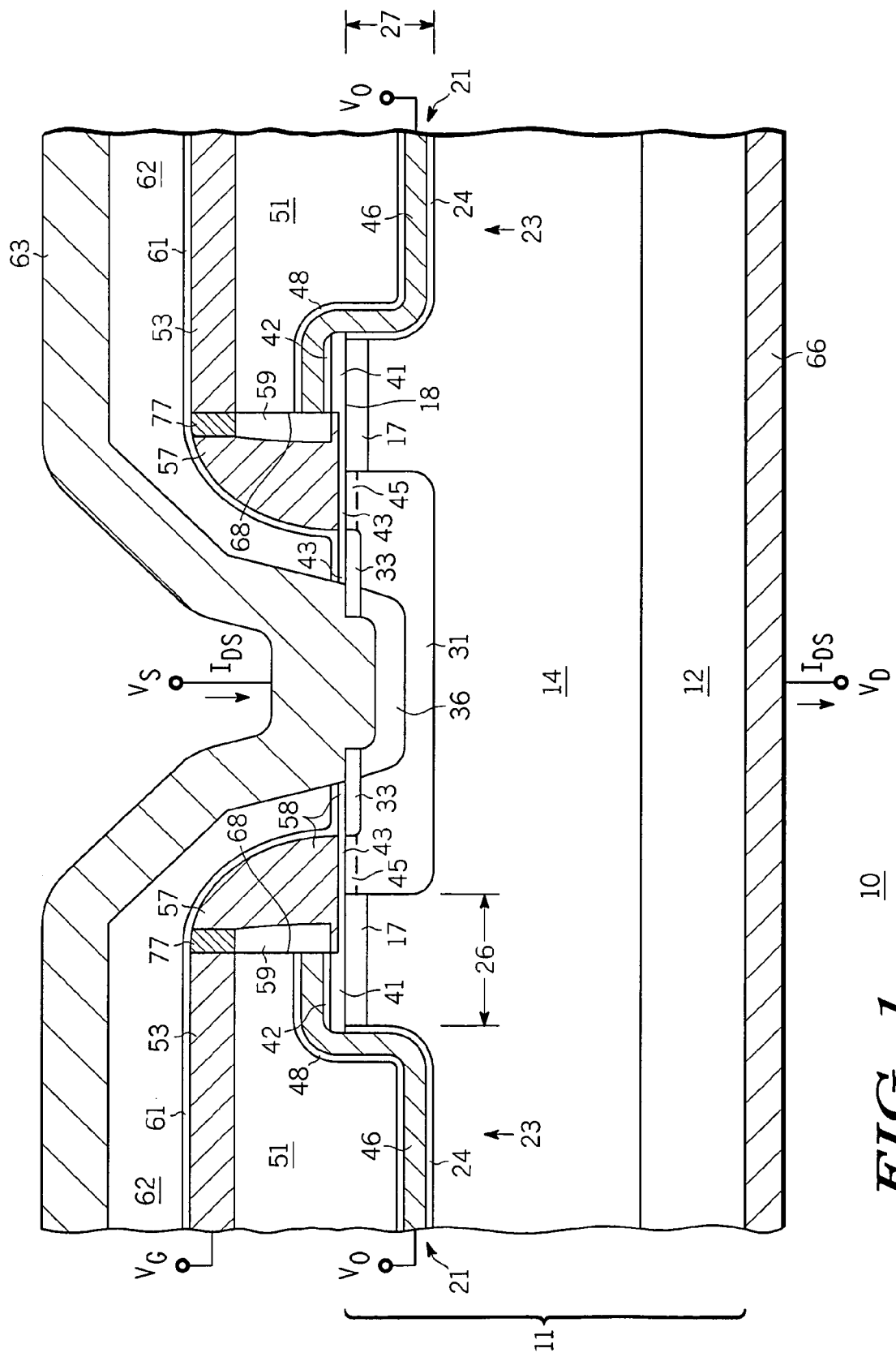
FIG. 1 illustrates a highly enlarged partial cross-sectional view of a semiconductor structure in accordance with an embodiment of the present invention.

For ease of understanding, elements in the drawing figures are not necessarily drawn to scale, and like element numbers are used where appropriate throughout the various figures. While the discussion below describes an n-channel device, the invention also pertains to p-channel devices, which may be formed by reversing the conductivity type of the described layers and regions.

In addition, the device of the present invention may embody either a cellular design (where the body regions are a plurality of cellular regions) or a single body design (where the body region is comprised of a single region formed in an elongated pattern, typically in a serpentine pattern). However, the device of the present invention will be described as a cellular design throughout the description for ease of understanding. It should be understood that it is intended that the present invention encompass both a cellular design and a single base design. Additionally, although the device of the present invention is shown as a MOSFET device, the present invention applies to bipolar transistors and insulated gate bipolar transistors as well as other devices comprising an input terminal, an output terminal and a control electrode.

FIG. 1 shows an enlarged partial cross-sectional view of an insulated gate field effect transistor (IGFET), MOSFET, power transistor, or switching device or cell 10 in accordance with an embodiment of the present invention. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises for example, an n-type silicon substrate 12 having a resistivity in range of approximately 0.001 to about 0.005 ohm-cm, and may be doped with arsenic. In the embodiment shown, substrate 12 provides a drain contact or a first current carrying contact. A semiconductor layer or extended drain region 14 is formed in or on substrate 12. In one embodiment, semiconductor layer 14 is formed using conventional epitaxial growth techniques. Alternatively, semiconductor layer 14 is formed using conventional doping and diffusion techniques. In an embodiment suitable for a 50 volt device, semiconductor layer 14 is n-type with a dopant concentration of about $1.0 \times 10^{15}$ atoms/cm$^3$, and has a thickness on the order of about 3 to about 5 microns. The thickness and dopant concentration of semiconductor layer 14 is increased or decreased depending on the desired $BV_{DSS}$ rating of device 10. It is understood that other materials may be used for body of semiconductor material 11 or portions thereof including silicon-germanium, silicon-germanium-carbon, carbon doped silicon, silicon carbide, or the like. Additionally, in an alternate embodiment, the conductivity type of substrate 12 is switched to be opposite the conductivity type of semiconductor layer 14 to form an insulated gate bipolar transistor 10.

Device 10 also includes an n-type region or blanket layer 17 formed in or adjacent to upper or major surface 18 of region of semiconductor material 11. N-type region 17 provides a low resistance current path for device 10. In an exemplary embodiment, n-type region 17 has a maximum concentration on the order of about $6.0 \times 10^{16}$ atoms/cm$^3$, and depth of about 0.4 microns.

A body, base, or doped region 31 is formed in semiconductor layer 14 and extends from major surface 18. By way of example, body region 31 comprises p-type conductivity, and has a dopant concentration suitable for forming an inversion layer that operates as conduction channels 45 of device 10. Body region 31 extends from major surface 18 to a depth, for example, of about 0.5 micron to about 3.0 microns. An n-type source region or current carrying region 33 is formed within or in body region 31 and extends from major surface 18 to a depth, for example, of about 0.1 microns to about 0.5 microns. A p-type body contact or contact region 36 is also formed in body region 31, and provides a lower contact resistance to body region 31 at major surface 18. In addition, contact region 36 lowers the sheet resistance of body region 31 under source region 33, which suppresses parasitic bipolar effects.

A first dielectric layer 41 is formed over or adjoining portions of major surface 18. For example, dielectric layer 41 comprises a thermal oxide layer having a thickness of about 0.05 microns to about 0.2 microns. A second dielectric layer 42 is formed over dielectric layer 41. In one embodiment, second dielectric layer 42 comprises silicon nitride, and has a thickness of about 0.05 microns to about 0.1 microns.

In accordance with the present invention, trench electrodes, screening electrodes, screening terminals, or second control terminal structures 21 are formed adjacent, in spaced relationship to, or in proximity to body region 31. In one embodiment, each of structures 21 comprise a trench or groove 23 formed in portions of semiconductor layer 14. Structures 21 further include third dielectric layers, electrode isolation layers, or gate dielectric layers 24 formed, which are formed over surfaces of trenches 23. Third dielectric layers 24 comprise for example, a silicon oxide having a thickness from about 0.03 microns to about 0.1 microns. In alternative embodiments, third dielectric layers 24 comprise silicon nitride, tantalum pentoxide, titanium dioxide, barium strontium titanate, or combinations thereof including combinations with silicon oxide, or the like.

Doped polycrystalline semiconductor layers or conductive layers 46 are formed over third dielectric layers 24 and second dielectric layer 42. In one embodiment, conductive layers 46 comprise doped polysilicon with a doping concentration of about $5.0 \times 10^{20}$ atoms/cm$^3$, have n-type conductivity, and have a thickness of about 0.1 microns. In an alternative embodiment, conductive layers 46 comprise p-type conductivity. By way of example, trenches 23 are spaced a distance 26 from about 0.5 microns to about 3.0 microns from body region 31. By way of further example, trenches 23 extend a distance 27 from major surface 18 from about 0.5 microns to about 1.5 microns.

A fourth dielectric layer 48 is formed over conductive layer 46, and a fifth dielectric layer 51 is formed over fourth dielectric layer 48. By way of example, dielectric layer 48 comprises silicon nitride (e.g., about 0.05 microns in thickness), and dielectric layer 51 comprises a deposited silicon oxide (e.g., about 0.7 microns in thickness). In one embodiment, dielectric layer 51 comprises a planarized dielectric to compensate for the presence of trenches 23. For example, dielectric layer 51 is planarized using chemical mechanical polishing techniques or the like after deposition. A conductive layer 53 is formed over dielectric layer 51, and comprises for example, n-type polycrystalline silicon or polysilicon (e.g., about 0.3 microns in thickness).

Gate dielectric layers 43 are formed over or adjoining other portions of major surface 18 adjacent to body region 31. Gate dielectric layers 43 comprise for example, silicon oxide, and have a thickness of about 0.01 microns to about 0.1 microns. In alternative embodiments, gate dielectric layers 43 comprise silicon nitride, tantalum pentoxide, titanium dioxide, barium strontium titanate, or combinations thereof including combinations with silicon oxide, or the like.

Conductive spacer gate regions, vertical spacer gate regions, or spacer defined gate regions or conductive electrodes 57 are formed over gate dielectric layers 43, and are isolated from conductive layers 46 by dielectric spacers 59. Conductive spacer gate regions 57 together with gate dielectric layers 43 form control electrodes, gate structures, or first control terminal structures 58. Conductive spacer gate regions 57 comprise, for example, n-type polycrystalline silicon or polysilicon, and are about 0.2 to about 0.8 microns in thickness. In an exemplary embodiment, dielectric spacers 59 comprise silicon nitride, and are about 0.1 microns in thickness. Spacer gate regions 57 are coupled to conductive layer 53 to provide a conductive gate structure, which controls the formation of channels 45 and the conduction of current in device 10.

In the embodiment shown, a conductive connective portion 77 couples spacer gate regions 57 to conductive layers 53. Conductive connective portions 77 comprise for example, n-type polysilicon. A spacer defined gate region refers to a control electrode formed with gate material deposited on one surface to control a channel formed on another perpendicular surface. In the case of device 10, channels 45 are formed at major surface 18, which is considered a horizontal surface. The control electrode film used to form spacer gate regions 57 is deposited along vertical surfaces 68, which are perpendicular to surface 18.

Conductive spacer gate regions 57 provide a minimal gate to drain overlap compared to conventional devices, thereby significantly reducing gate charge. Additionally, in device 10 the electrical routing for the gate is provided by conductive layer 53, which is elevated above major surface 18 thereby further reducing gate charge. Further, conductive layer 46 functions, among other things, as a ground plane or shield layer interposed between the gate and drain regions to further reduce gate to drain capacitance. These features provide enhanced switching speed and reduced input charge requirements.

A sixth dielectric layer 61 is formed over portions of device 10, and comprises for example, silicon nitride having thickness of about 0.05 microns. An interlayer dielectric (ILD) layer 62 is formed over portions of device 10, and comprises for example, a deposited silicon oxide having a thickness of about 0.8 microns. An opening is formed in the dielectric layers to provide a contact to device 10 for source contact layer 63. As shown, a portion of major surface 18 is etched so that source contact layer 63 makes contact to both source regions 33 and body region 36. In one embodiment, source contact layer 63 comprises an aluminum silicon alloy or the like. A drain contact layer or conduction electrode 66 is formed on an opposing surface of region of semiconductor material 11, and comprises, for example, a solderable metal structure such a titanium-nickel-silver, chrome-nickel-gold, or the like.

The operation of device 10 proceeds as follows. Assume that source or input terminal 63 is operating at a potential $V_S$ of zero volts, spacer gate regions 57 receive a control voltage $V_G$=2.5 volts, which is greater than the conduction threshold of device 10, and drain or output terminal 66 operates at drain potential $V_D$=5.0 volts. The values of $V_G$ and $V_S$ cause body region 31 to invert under spacer gate regions 57 to form channels 45, which electrically connect source regions 33 to layer 17. A device current $I_{DS}$ flows from source terminal 63 and is routed through source regions 33, channels 45, layer 17, and semiconductor layer 14 to drain terminal 66. In one embodiment, $I_{DS}$=1.0 amperes. To switch device 10 to the off state, a control voltage $V_G$ of less than the conduction threshold of device is applied to spacer gates 57 (e.g., $V_G$<2.5 volts). This removes channels 45 and $I_{DS}$ no longer flows through device 10.

Screening electrodes 21 are tied, coupled, or fixed to a potential $V_O$ that is the same as a supply voltage, an intermediate voltage, an independent voltage, voltage signal, or ground. In the off state, screening electrodes 21 act as a voltage screen between gate control electrodes 58 and drain or output electrode 66. That is, screening electrodes 21 function to planarize the electrostatic potential and reduce the radius of curvature effects that occur at the corners of body region 31 and semiconductor layer 14 when device 10 is in the off or blocking state.

More particularly, screening electrodes 21 divide the large potential difference between the input and output of device 10 into two portions, the larger of which is between screening electrodes 21 and the output terminal (e.g., drain terminal 66) and the smaller of which is between screening electrodes 21 and gate structures 58 and the input terminal (e.g., source terminal 63). This voltage difference produces several results.

First, traditional high voltage techniques can be used to accommodate the larger portion of the potential difference between screening electrode 21 and the output terminal, which makes device 10 more compatible with existing high voltage technologies. Such techniques include adjusting the thickness and dopant concentration of semiconductor layer 14 and the thickness of dielectric layer 24 to meet a given breakdown voltage requirement. Because of the voltage screening effects of screening electrodes 21, other portions of device 10 such as the thickness of gate oxide 43 or the dopant concentration of layer 17 can be scaled to values that would otherwise not be feasible without the voltage screening effect. This improves the overall performance of device 10 including improvements in current capacity and switching speed.

Additionally, because screening electrodes 21 isolate control electrodes 58 from output terminal 66 and its ultimate load ($V_D$), more ideal output characteristics can be achieved. For example, the isolation provided results in output currents ($I_{DS}$) that are more insensitive to changes in output voltage ($V_D$) and thus, depend upon changes in control voltage ($V_G$) only.

Finally, screening electrodes 21 can be used to create charge accumulation at the surfaces of trenches 23 when device 10 is in the on state, which further acts to increase drain current $I_{DS}$ and reduce on state resistance.

Figure 2:
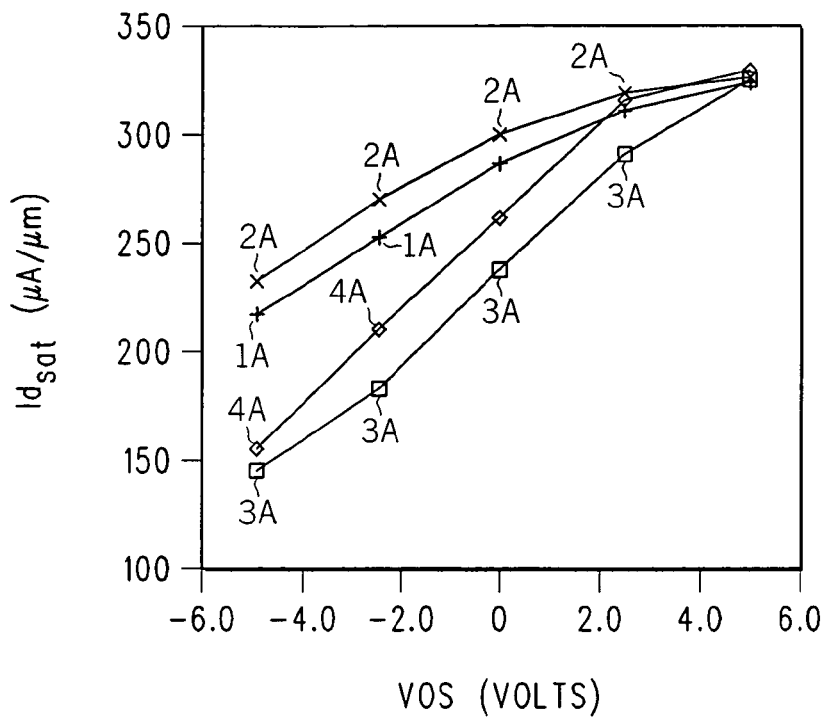
FIG. 2 is a graph showing drain saturation current ($I_{DSat}$) as a function of screen electrode bias ($V_{OS}$) for various embodiments of the present invention.

FIG. 2 is a graph showing drain current $I_{DS}$ performance for device 10 as a function of an independent screen to source voltage ($V_{OS}$=$V_O$-$V_S$) applied to screening electrode 21 with a $V_{GS}$ bias of 5.0 volts. Additionally, FIG. 2 compares device 10 having a p-type conductive layer 46 (data 3A) and an n-type conductive layer 46 (data 4A). These two structures are further compared to a device having a planar or non-trench structure with a p-type electrode (data 1A) and a device having a planar or non-trench structure with an n-type electrode (data 2A).

Figure 3:
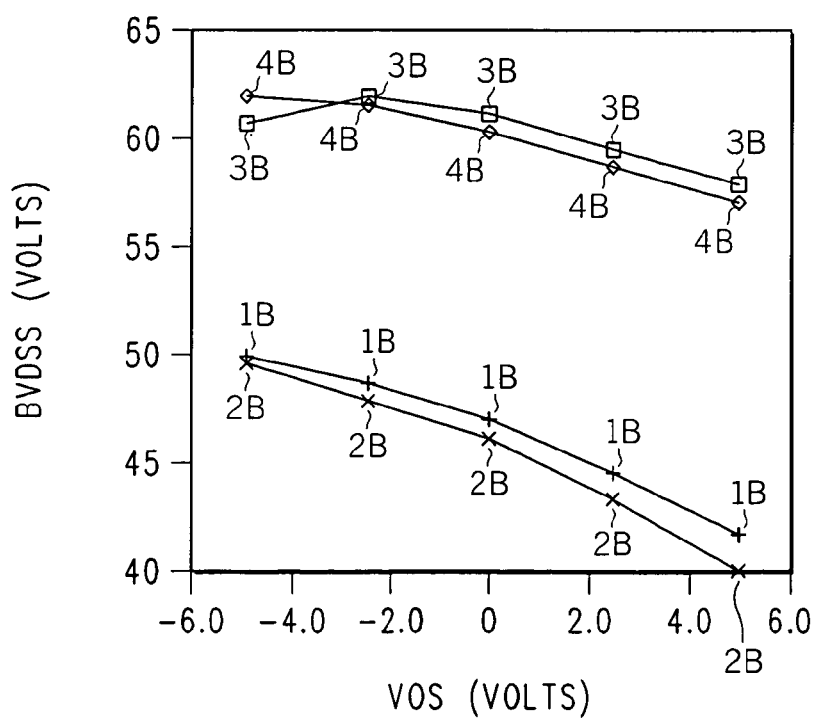
FIG. 3 is a graph showing breakdown voltage ($BV_{DSS}$) as a function of screen electrode bias ($V_{OS}$) for various embodiments of the present invention.

FIG. 3 is a graph showing breakdown voltage ($BV_{DSS}$) as a function of an independent screen to source voltage ($V_{OS}$) applied to screening electrode 21. Additionally, FIG. 3 compares device 10 having a p-type conductive layer 46 (data 3B) and an n-type conductive layer 46 (data 4B). These two structures are further compared to a device having a planar or non-trench structure with a p-type electrode (data 1B) and a device having a planar or non-trench structure with an n-type electrode (data 2B).

Figure 4:
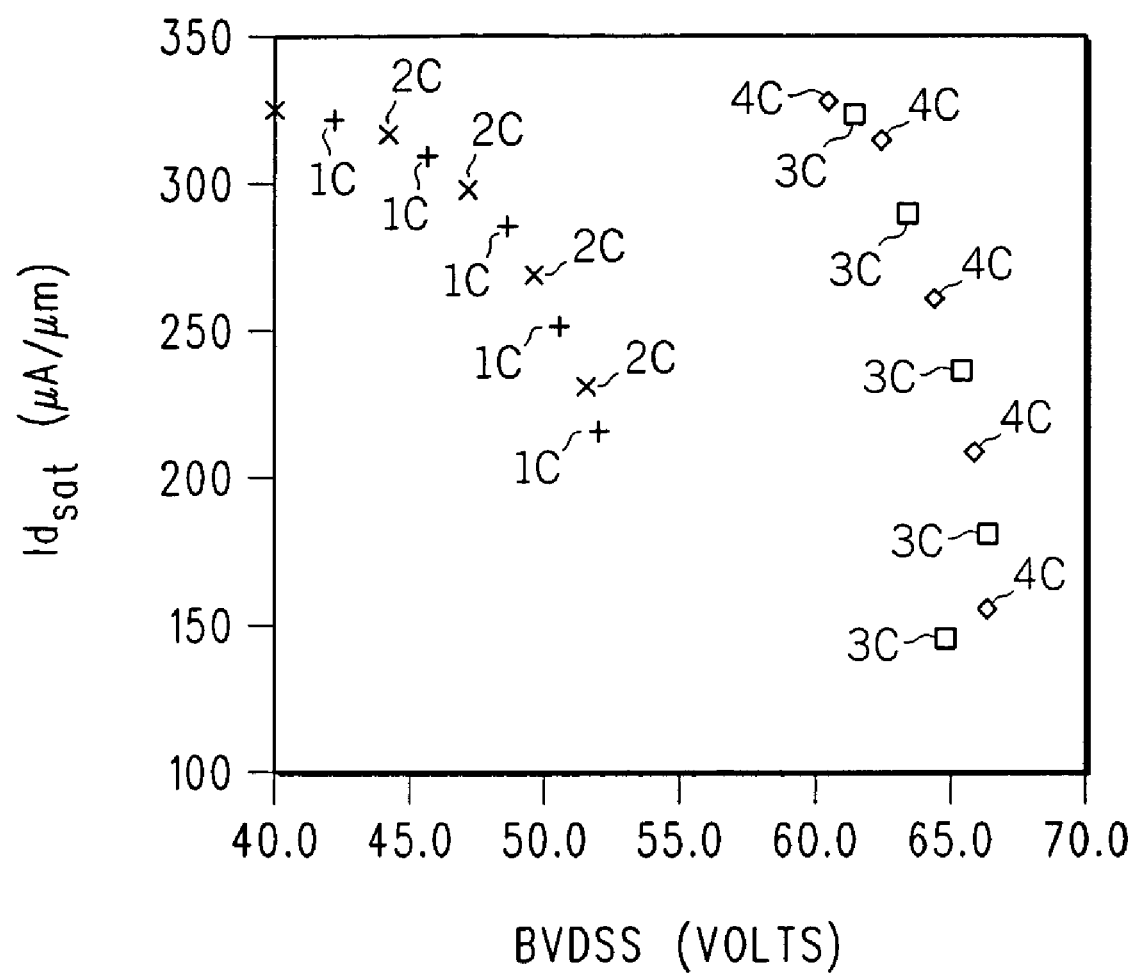
FIG. 4 is a graph showing a correlation between $I_{DSat}$ and $BV_{DSS}$ at various screen electrode biases from FIGS. 2 and 3 for various embodiments of the present invention.

FIG. 4 is a graph showing $I_{DSAT}$ as a function of $BV_{DSS}$ as a composite or correlation of FIGS. 2 and 3. Data elements 1C correspond to a planar structure with a p-type electrode, data elements 2C correspond to a planar structure with an n-type electrode, data elements 3C correspond to device 10 having a p-type conductive layer 46, and data elements 4C correspond to device 10 having an n-type conductive layer 46. As shown in FIG. 4, device 10 having screening electrode 21 in accordance with the present invention provides enhanced $BV_{DSS}$ performance while achieving excellent $I_{DSAT}$ characteristics.

Figure 5:
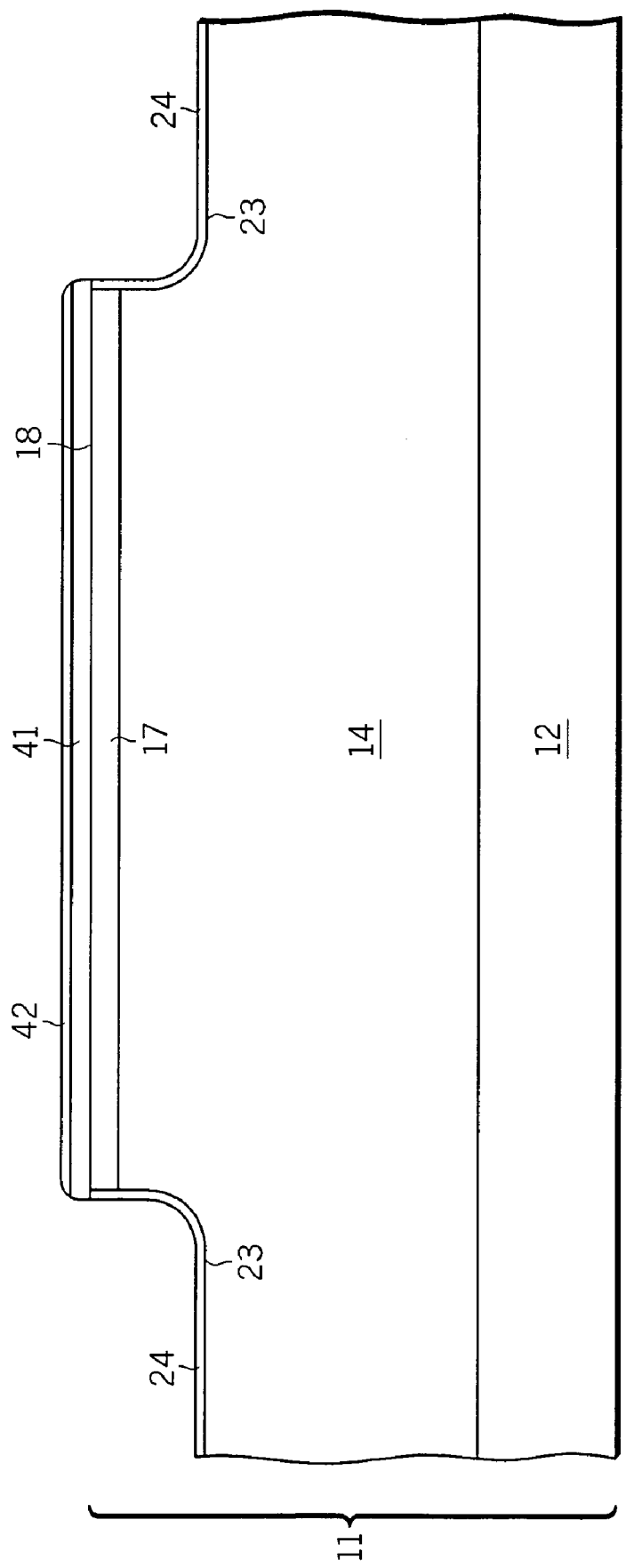
FIG. 5 illustrates a highly enlarged partial cross-sectional view of an embodiment of the present invention at an early stage of fabrication.

Turning now to FIGS. 5-10, a process for forming device 10 in accordance with the present invention is described. FIG. 5 shows an enlarged partial cross-sectional view of device 10 at an early stage of fabrication. Body of semiconductor material 11 is provided with n-type layer 17 formed in semiconductor layer 14. In one embodiment, phosphorous is implanted at a dose of about $2.0 \times 10^{12}$ atoms/cm$^2$ and an implant energy of 600 KeV to form n-type layer 17. First dielectric layer 41 is formed over major surface 18, and comprises for example, a silicon oxide about 0.05 microns to about 0.2 microns thick. A thermal oxide grown at about 900 degrees Celsius is suitable. Second dielectric layer 42 is then deposited over first dielectric layer 41, and comprises, for example, about 0.05 to about 0.1 microns of silicon nitride. Next, a conventional photolithography and etch step is used form openings in first and second dielectric layers 41 and 42 to expose portions of major surface 18. Next, trenches 23 are formed in semiconductor layer 14 and extend from major surface 18. By way of example, trenches 23 are etched in a dry etch system using fluorine or chlorine based chemistries. Trenches 23 comprise a single continuous trench or connected trench matrix. Alternatively, trenches 23 comprise a plurality of individual trenches with closed ends and separated by portions of body of semiconductor material 11. Third dielectric layers 24 are then formed over the surfaces of trenches 23, and comprise, for example, a silicon oxide having a thickness from about 0.03 microns to about 0.1 microns.

Figure 6:
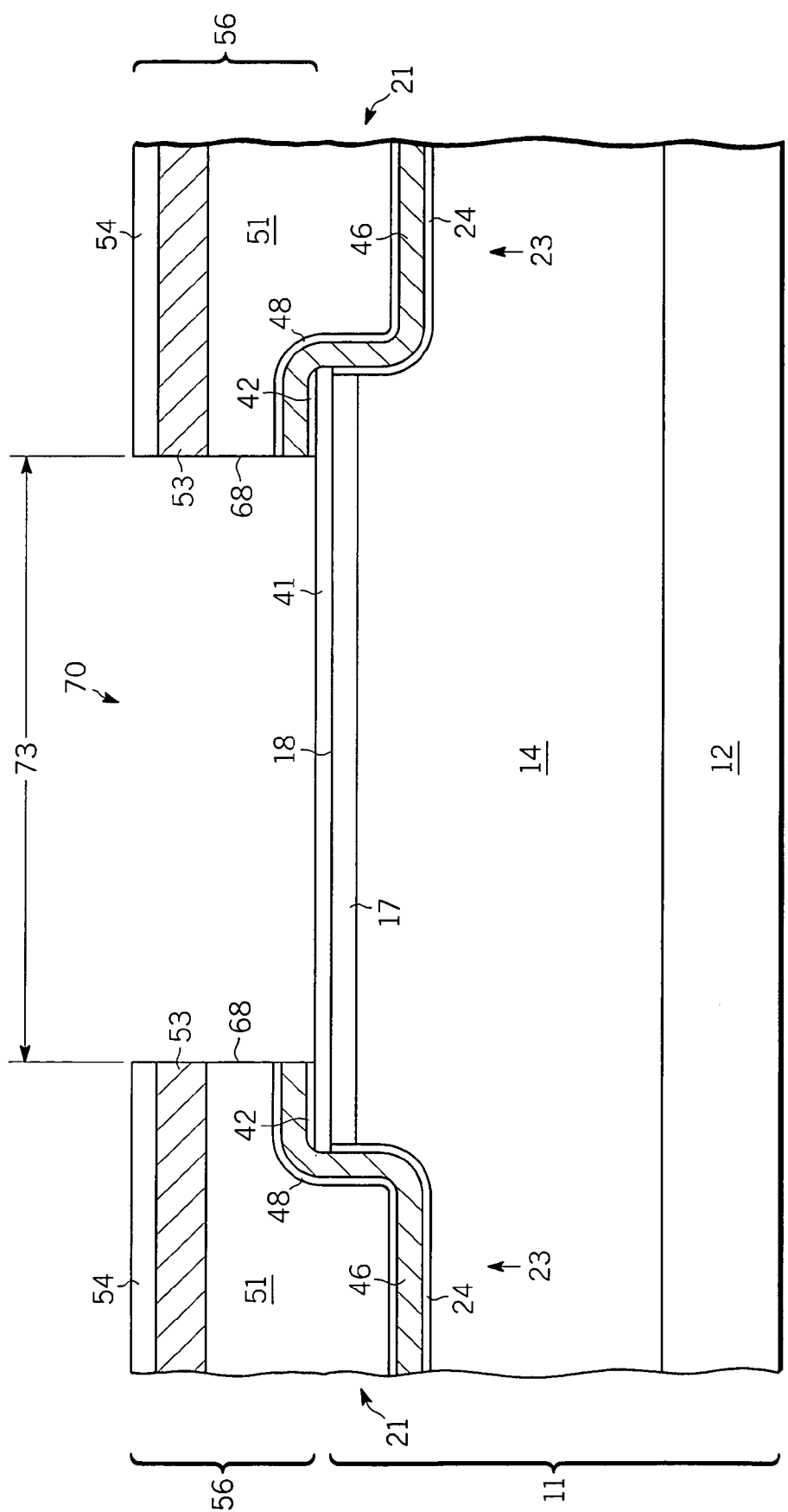
FIG. 6 illustrates a highly enlarged partial cross-sectional view of an embodiment of the present invention at a later stage of fabrication.

FIG. 6 shows a highly enlarged partial cross-sectional view of an embodiment of device 10 at a later stage of fabrication. Conductive layer 46 is then formed over third dielectric layer 24 and remaining portions of second dielectric layer 42. In one embodiment, conductive layer 46 comprises about 0.1 microns of polysilicon, and is either deposited doped or undoped. If conductive layer 46 is deposited initially undoped, conductive layer 46 is subsequently doped using, for example, ion implantation techniques. In one embodiment, conductive layer 46 is n-type and doped with phosphorous. A phosphorous ion implant dose of about $5.0 \times 10^{15}$ to about $1.0 \times 10^{16}$ atoms/cm$^2$ with an implant energy of about 60 KeV is sufficient for doping conductive layer 46. In an alternative embodiment, conductive layers 46 comprise p-type conductivity, and a boron ion implant dose of about $5.0 \times 10^{15}$ to about $1.0 \times 10^{16}$ atoms/cm$^2$ with an implant energy of about 30 KeV is sufficient for doping conductive layer 46.

Next, fourth dielectric layer 48 is formed over conductive layer 46, and fifth dielectric layer 51 is formed over fourth dielectric layer 48. Fourth dielectric layer 48 comprises, for example, silicon nitride (e.g., about 0.05 microns in thickness), and dielectric layer 51 comprises a deposited oxide (e.g., about 0.7 microns in thickness). In one embodiment, the upper surface of fifth dielectric layer 51 is planarized using for example, chemical mechanical polishing processes or the like.

Conductive layer 53 is then formed over fifth dielectric layer 51, and comprises for example, n-type polysilicon (e.g., about 0.3 microns in thickness). A protective layer 54 is formed over conductive layer 53, and comprises for example, about 0.15 microns of silicon nitride.

A photolithographic and etch step is done to etch through portions of layers 54, 53, 51, 48, 46 and 42 to provide an opening 70. This also forms pedestal stack structures 56, which are comprised of remaining portions of layers 42, 46, 48, 51, 53 and 54. In one embodiment, opening 70 has a width 73 on the order of about 5.0 microns to about 8.0 microns.

Figure 7:
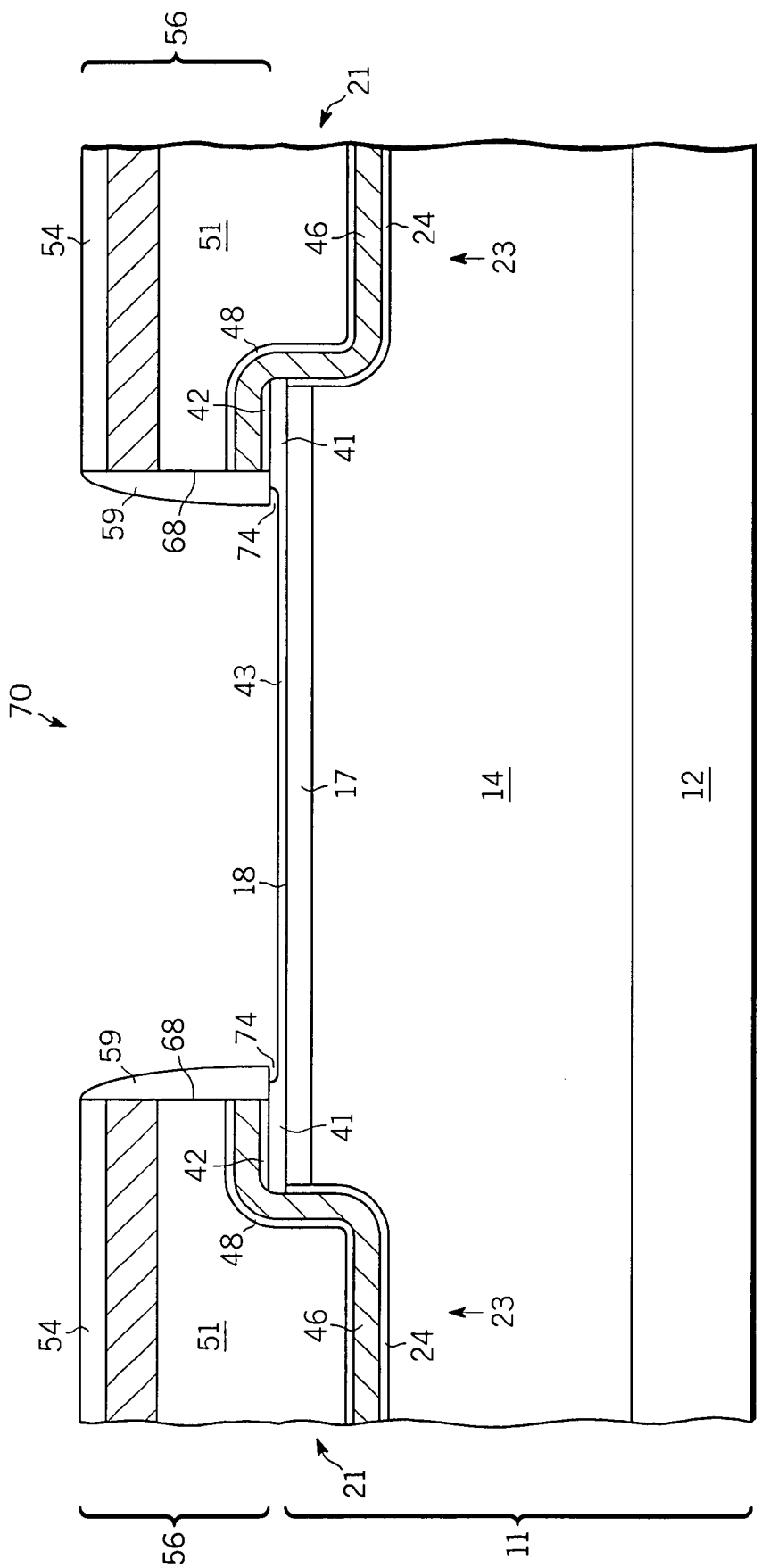
FIG. 7 illustrates a highly enlarged partial cross-sectional view of an embodiment of the present invention at a still later stage of fabrication.

FIG. 7 shows an enlarged partial cross-sectional view of device 10 after additional processing steps that form dielectric spacers 59. In one embodiment, a silicon nitride film is deposited over pedestal stack structures 56 and first dielectric layer 41. By way of example, a silicon nitride film about 0.1 microns thick is deposited using chemical vapor deposition techniques. Next, a conventional anisotropic etch back step is used to remove portions of the silicon nitride layer over pedestal stack structures 56 and first dielectric layer 41 while leaving portions of the silicon nitride layer on sidewalls or vertical surfaces 68 to form dielectric spacers 59.

In a further step, a silicon oxide wet etch is then used to remove portions of dielectric layer 41 within opening 70. By way of example, a diluted hydrofluoric acid (e.g., 50:1) is used to etch dielectric layer 41. In an exemplary embodiment, the etch time is prolonged (e.g., 8 to 15 minutes) in order to undercut or remove material from dielectric layer 41 from beneath dielectric spacers 59 to form recessed portions 74. Recessing dielectric layer 41 in this manner ensures that channels 45 (shown in FIG. 1) formed in body region 31 extend into semiconductor layer 14 to allow channel current to flow more efficiently. In an exemplary embodiment, portions 74 are recessed under dielectric spacers 59 a distance of less than about 0.1 microns. A thermal silicon oxide is then grown on major surface 18 within opening 70 to thickness of about 0.0125 microns to form gate dielectric layer 43.

Figure 8:
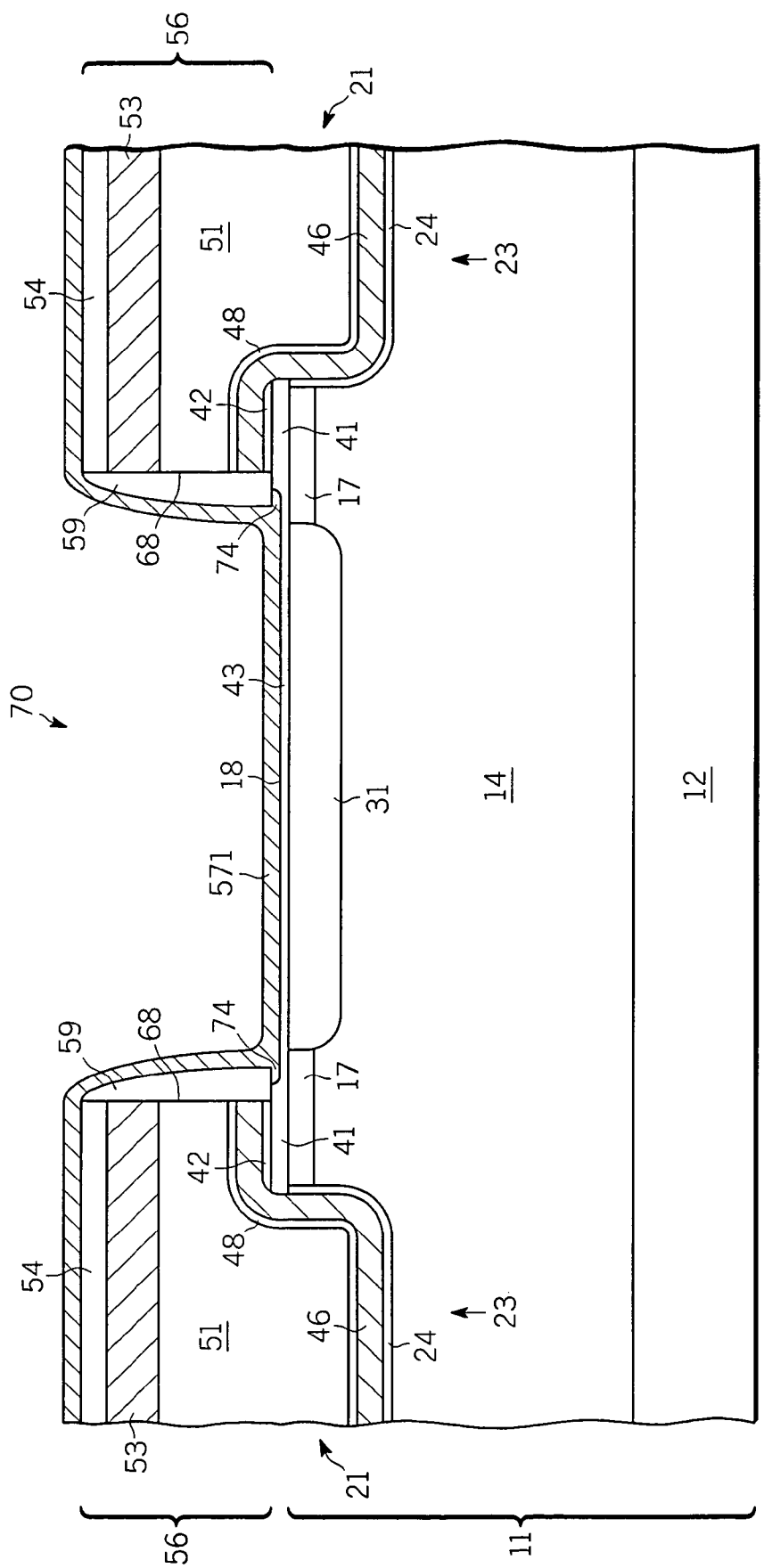
FIG. 8 illustrates a highly enlarged partial cross-sectional view of an embodiment of the present invention at a further stage of fabrication.

FIG. 8 shows an enlarged partial cross-sectional view of device 10 after additional processing. A conformal layer of semiconductor material 571 is deposited over device 10 to a thickness of about 0.1 microns to about 0.15 microns. Boron dopant is then introduced through opening 70 and conformal layer of semiconductor material 571 into major surface 18 to provide p-type dopant for body region 31. By way of example, conformal layer of semiconductor material 571 comprises undoped polysilicon, and the boron is implanted through the undoped polysilicon into semiconductor layer 14. An ion implant dose of about $1.0 \times 10^{13}$ atoms/cm$^2$ and an implant energy of about 120 KeV is suitable for a 50 volt device.

Figure 9:
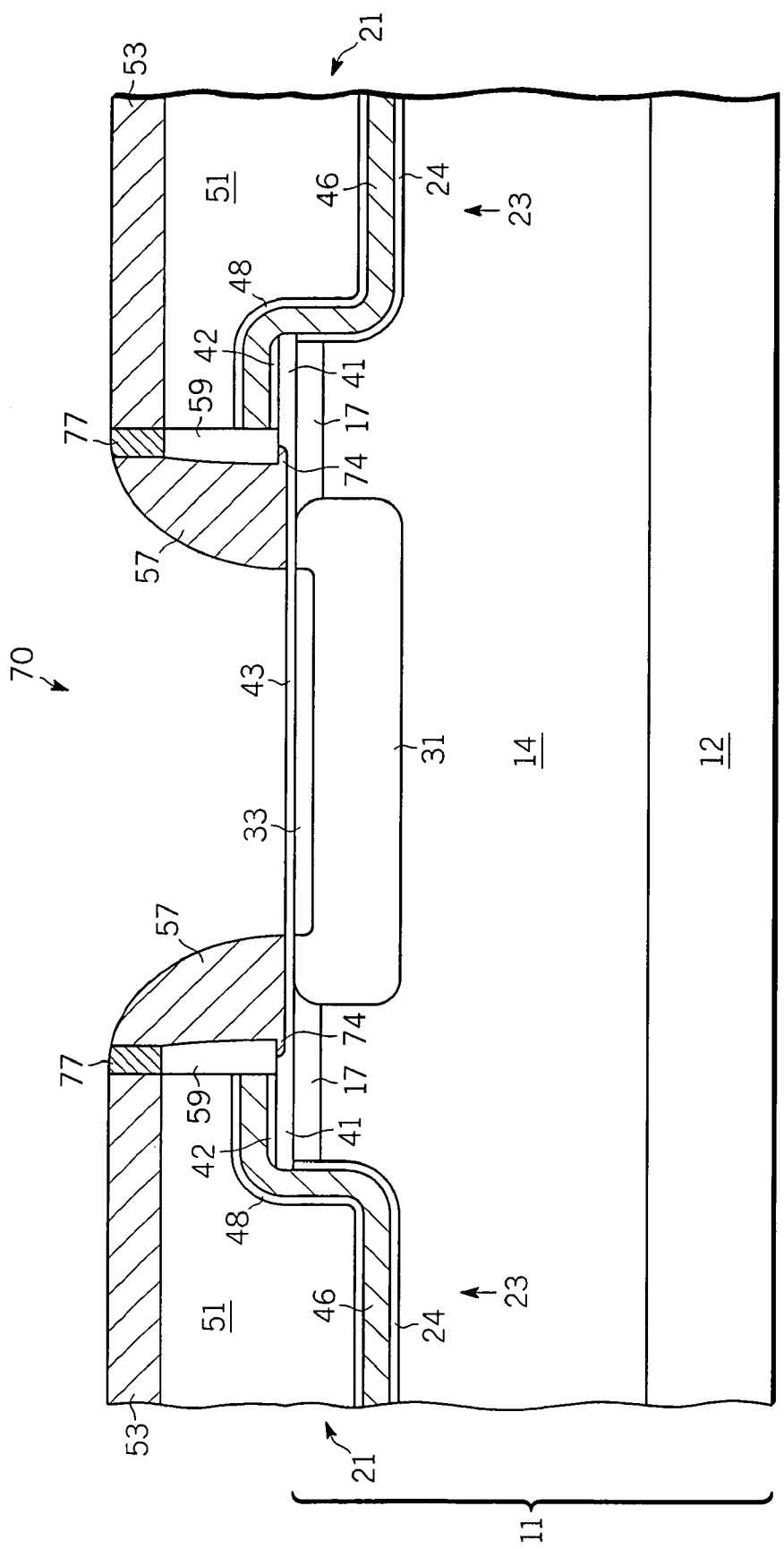
FIG. 9 illustrates a highly enlarged partial cross-sectional view of an embodiment of the present invention at a still further stage of fabrication.

FIG. 9 shows an enlarged partial cross-sectional view of device 10 after further processing. A second conformal layer of semiconductor material is deposited over conformal layer of semiconductor material 571 and both layers are etched to provide spacer gates 57. By way of example, the second conformal layer of semiconductor material comprises about 0.2 microns of n-type polysilicon, which may be doped during the deposition process or doped subsequently using ion implantation or other doping techniques. After spacer gates 57 are formed, an additional 0.015 microns of gate dielectric (e.g., silicon oxide) is added to the surface of spacer gates 57 and exposed portions of gate oxide 43.

In one embodiment, the etch step that forms spacer gates 57 also exposes protective layer 54 and the upper portions of dielectric spacers 59. Protective layer 54 and the upper portions of dielectric spacers 59 are then etched so that protective layer 54 is removed, and upper portions of dielectric spacers 59 are removed between spacer gates 57 and conductive layers 53. This leaves a gap between conductive layers 53 and spacer gates 57.

In a further step, conductive material such as polysilicon is deposited to provide connective conductive portions 77. Connective conductive portions 77 fill the gap formed during the removal of protective layer 54 and portions of dielectric spacers 59, and couple or electrically connect spacer gates 57 to conductive layers 53. An n-type doping step is then done to dope connective conductive portions 77, and to provide dopant for source regions 33. In an exemplary embodiment, an arsenic implant dose of $3.0 \times 10^{15}$ atoms/cm$^2$ with an implant energy of 80 KeV is used for this doping step. In one embodiment, the implanted dopants are then activated and diffused at this stage of fabrication. Alternatively or in addition, the dopants are activated and diffused after the steps described in FIG. 10 below.

Figure 10:
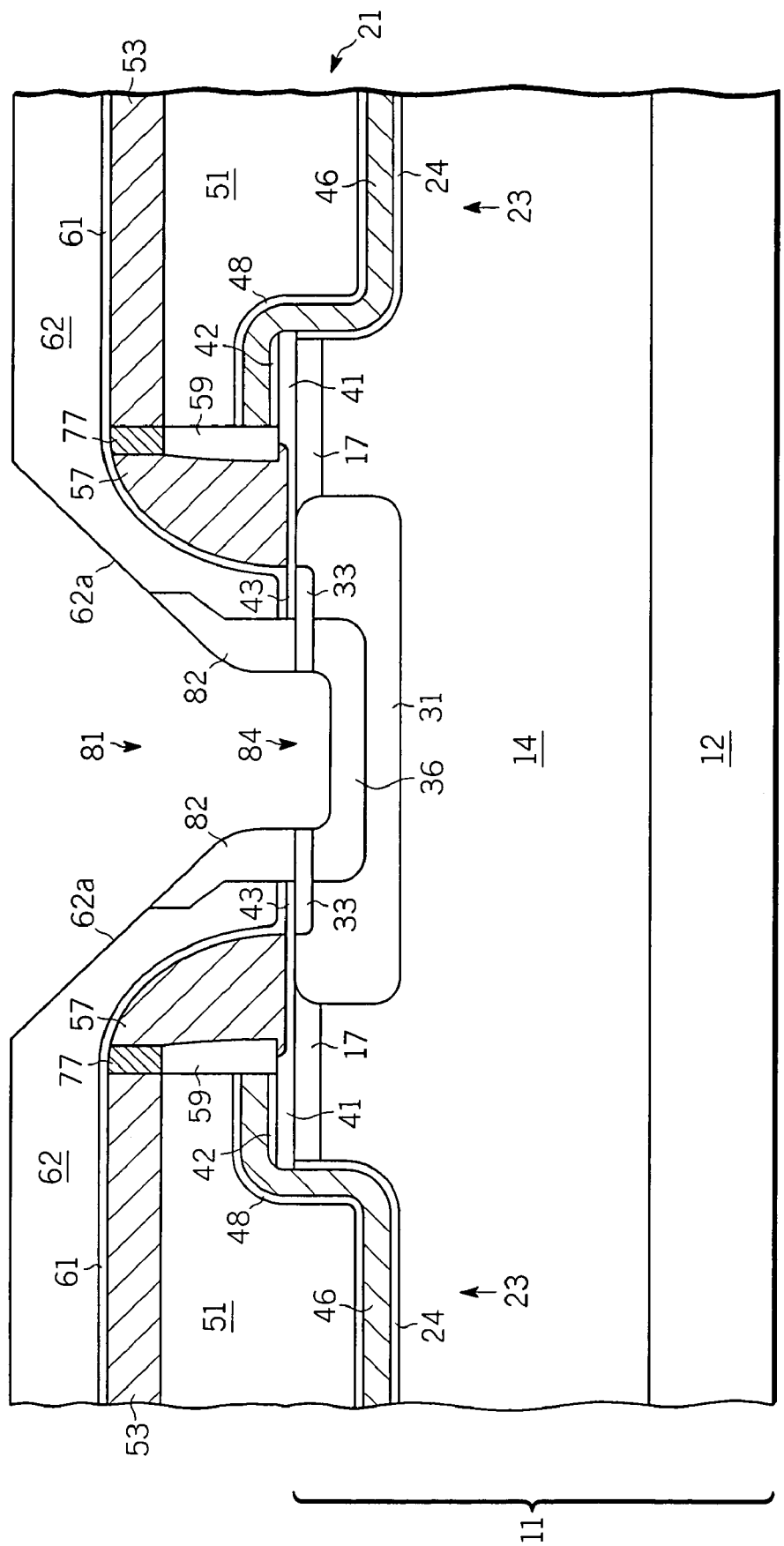
FIG. 10 illustrates a highly enlarged partial cross-sectional view of an embodiment of the present invention after an additional stage of fabrication.

FIG. 10 shows an enlarged partial cross-sectional view of device 10 after further steps in fabrication. Sixth dielectric layer 61 is deposited, and comprises for example, about 0.05 microns of silicon nitride. ILD layer 62 is then deposited over sixth dielectric layer 61. In an exemplary embodiment, ILD layer 62 comprises a deposited silicon oxide about 0.8 microns in thickness. An optional ILD taper etch is used to taper portions 62a of ILD layer 62, which helps with step coverage for subsequently formed layers.

Next, a conventional photolithographic and etch step is used to form contact opening 81, which exposes a portion of major surface 18. Contact region 36 is then formed through opening 81 using a p-type ion implantation step. By way of example, a boron ion implant dose of $3.0 \times 10^{14}$ atoms/cm$^2$ and an implant energy of 80 KeV is used. A conformal spacer layer is then deposited and etched to form spacers 82. In an exemplary embodiment, a 0.3 micron layer of silicon nitride is deposited and etched to form spacers 82. A rapid anneal step is used at this point to activate and diffuse the various ion implants. For example, device 10 is exposed to a temperature of about 1030 degrees Celsius for about 45 seconds.

An etch step is then used to remove a portion of major surface 18 to form recessed portion 84. This allows source contact layer 63 to contact both source regions 33 and contact region 36, which shorts these regions together. Spacers 82 are then removed. In subsequent processing, source contact layer 63 is deposited and patterned. Substrate 12 is then optionally thinned, and drain contact layer 66 is deposited to provide the structure shown in FIG. 1. It is further understood that other conductive layers such as silicide layers may be formed before depositing source contact layer 63.

In view of all the above, it is evident that a novel device and methods of its manufacture are disclosed. Included, among other features, is a semiconductor device with a screening electrode or electrodes formed in proximity to the device's channel regions that, among other things, enhance breakdown voltage performance. The screening electrodes also allow for the use of an n-type doped region between the channel regions and the screening electrodes, which improves drain current and on resistance without significantly impacting switching performance.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor device, comprising:
a substrate having a major surface, wherein the substrate comprises a first conductivity type;
a pedestal structure formed overlying a portion of the major surface;
a conductive material disposed along a side surface of the pedestal structure to define an edge of a first conduction electrode of the semiconductor device;
a first doped region of a second conductivity type formed in the major surface adjacent the first conduction electrode, wherein a portion of the first doped region forms a channel region when the semiconductor device is in operation;
a first current carrying region of the first conductivity type formed in the first doped region; and
a screening electrode formed adjacent the major surface and in proximity to the first doped region, wherein the screening electrode comprises:
a trench formed in the major surface;
a dielectric layer formed over surfaces of the trench; and
a conductive layer formed over the dielectric layer.

2. The semiconductor device of claim 1, wherein the substrate includes a semiconductor layer of a first conductivity type formed over the substrate, wherein the semiconductor layer has a lower doping concentration than the substrate.

3. The semiconductor device of claim 2 further comprising a second doped region of the first conductivity type formed adjacent the major surface between the first doped region and the screening electrode.

4. The semiconductor device of claim 1, wherein the substrate comprises one of silicon-germanium, silicon-germanium-carbon, or carbon doped silicon.

5. The semiconductor device of claim 1, wherein the conductive layer comprises polysilicon.

6. The semiconductor device of claim 5 wherein the conductive layer comprises p-type conductivity.

7. The semiconductor device of claim 5 wherein the conductive layer comprises n-type conductivity.

8. The semiconductor device of claim 1, wherein a second surface of the substrate forms a second current carrying region.

9. The semiconductor device of claim 1, wherein the screening electrode is coupled to the first current carrying region.

10. The semiconductor device of claim 1, wherein the screening electrode is configured to be independently biased.

11. The semiconductor device of claim 1, wherein the pedestal structure includes:
a first dielectric layer formed over the top surface of the substrate;
a second dielectric layer formed over the first dielectric layer; and
a conductive layer formed over the second dielectric layer, wherein the conductive layer is coupled to the conductive material.

12. A semiconductor device, comprising:
a semiconductor substrate having a semiconductor layer of a first conductivity type, wherein the semiconductor layer has a major surface;
a body region of a second conductivity type disposed in semiconductor layer for forming a channel of the semiconductor device;
a first current carrying region of the first conductivity type formed in the body region;
a gate structure formed over the top surface adjacent the channel; and
a screening electrode formed in the semiconductor layer in proximity to the body region, wherein the screening electrode comprises:
a trench formed in the major surface;
a dielectric layer formed in the trench; and
a conductive electrode formed over the dielectric layer.

13. The semiconductor device of claim 12 wherein the semiconductor layer comprises one of silicon-germanium, silicon-germanium-carbon, carbon doped silicon, or silicon carbide.

14. The semiconductor device of claim 12, wherein the conductive electrode comprises n-type polysilicon.

15. The semiconductor device of claim 12 further comprising a pedestal structure formed over the major surface, and wherein the gate structure includes a control electrode formed along a side surface of the pedestal structure.

16. The semiconductor device of claim 12, wherein the substrate comprises the second conductivity type.

* * * * *